United States Patent [19]

Goto

[11] Patent Number: 5,493,208
[45] Date of Patent: Feb. 20, 1996

[54] WAVEFORM DISPLAYING METHOD AND WAVEFORM ANALYZING APPARATUS

[75] Inventor: Norio Goto, Tokyo, Japan

[73] Assignee: NEC Corporation, Tokyo, Japan

[21] Appl. No.: 5,557

[22] Filed: Jan. 19, 1993

[30] Foreign Application Priority Data

Jan. 20, 1992 [JP] Japan ..................... 4-007040

[51] Int. Cl.$^6$ .................... G01R 31/26
[52] U.S. Cl. .................. 324/73.1; 324/121 R
[58] Field of Search ............... 324/73.1, 158 R, 324/121 R, 158 T, 765, 767, 158.1; 364/487, 481, 483; 340/706

[56] References Cited

U.S. PATENT DOCUMENTS

| | | | |
|---|---|---|---|
| 4,437,060 | 3/1984 | Ferenczi et al. | 324/767 |
| 4,495,585 | 1/1985 | Buckley | 364/487 |
| 4,559,602 | 12/1985 | Bates, Jr. | 364/487 |
| 4,571,541 | 2/1986 | Ferenczi et al. | 324/767 |
| 5,047,713 | 9/1991 | Kirino et al. | 324/767 |

OTHER PUBLICATIONS

H. Okushi et al., "Isothermal Capacitance Transient Spectroscopy", Japanese Journal of Applied Physics, vol. 20 (1981) Supplement 20–1, pp. 261–264.

D. V. Lang, "Deep–level transient spectroscopy: A new method to ... semiconductors", Journal of Applied Physics, vol. 45, No. 7, Jul. 1974, pp. 3023–3032.

*Primary Examiner*—Vinh P. Nguyen
*Attorney, Agent, or Firm*—Sughrue, Mion, Zinn, Macpeak & Seas

[57] ABSTRACT

Temperature-dependent waveforms, variable with time, of the output characteristics such as current, capacitance, threshold voltage, and the like of a semiconductor device are measured and analyzed in a short period of time for accurately and quickly identifying deep levels in the semiconductor device. When a step voltage is applied to a terminal of the semiconductor device, the output characteristics thereof respond with a waveform I. After the elapse of a time t from the application of the step voltage, the value of t·(dI/dt) is measured and stored at a plurality of temperatures T. The recorded values are three-dimensionally displayed in a space coordinate system having an x-axis representing 1/T, a y-axis representing $\log(tT^2)$, and a z-axis representing t·(dI/dt).

4 Claims, 16 Drawing Sheets

FIG.3

STEP VOLTAGE APPLIED $t=0$

RESPONSE WAVEFORM
I $\exp(-e_n t)$

DERIVATIVE OF RESPONSE WAVEFORM
$t = \dfrac{dI}{dt}$ $e_n t \cdot \exp(-e_n t)$ $t=0$    $t = t_{max} = \dfrac{1}{e_n}$

WAVEFORM DISPLAYING METHOD AND WAVEFORM ANALYZING APPARATUS

BACKGROUND OF THE INVENTION

1. Field of the Invention

The present invention relates to a waveform displaying method and a waveform analyzing apparatus for use in the evaluation of a deep level that is present in either a semiconductor device such as a transistor, a diode, or the like which is mounted on a semiconductor substrate of gallium arsenide, for example, or the semiconductor substrate.

2. Description of the Related Art

It is known in the art that in various semiconductor devices including transistors and diodes which are made of semiconductors including gallium arsenide (GaAs), the characteristics of the devices suffer various parasitic effects when a deep level in the forbidden band gap that is present in a semiconductor substrate or on the surface thereof captures or emits a carrier (electrons or holes). For example, the deep level present in the conduction region of a device captures or emits a carrier, resulting in a delay of the response of a current flowing through the device, a junction capacitance, and a threshold voltage.

The capture of a carrier by the deep level depends on the concentration of a free carrier, and is difficult to analyze. The emission of a carrier from the deep level is not governed by the free-carrier concentration because the destination band's free-carrier concentration is usually considerably lower than the effective density of states. The ratio of the amount of carrier emitted from the deep level to the amount of carrier remaining in the deep level per unit time, i.e., the emission rate, is substantially constant. The amount of carrier that remains in the deep level is reduced exponentially with time.

If the amount of carrier emitted from the deep level is proportional to the rate at which the current varies, the current will also vary exponentially. An exponential function indicative of the change in the amount of carrier held by the deep level, or the change in the current is proportional to:

$$\exp(-e_n \cdot t) \quad (1)$$

where $e_n$ is the carrier emission rate. The emission rate $e_n$ itself depends on the temperature. If the carrier is an electron, then the carrier emission rate $e_n$ is expressed by the following simple equation:

$$e_n = N_c t_{th} \sigma_n \cdot \exp(-E_T/kT) \quad (2)$$

where $N_c$ is the effective density of states of the electrons which is proportional to the (3/2)th power of the temperature T, and $v_{th}$ is the thermal velocity of the electrons which is proportional to the (1/2)th power of the temperature T. Therefore, the carrier emission rate depends on the product of an exponential function of $(-1/T)$ and square of the temperature T. In equation (2), $E_T$ represents the activation energy of the deep level, and $\sigma_n$ the capture cross-section. The same equation is satisfied when the carrier is a hole. To determine these parameters, the waveform of a current response or the like is analyzed according to equation (1) to find the carrier emission rate $e_n$ at a certain temperature, and the temperature-dependency thereof is then applied to equation (2) to obtain the activation energy $E_T$ of the deep level and the capture cross-section $\sigma_n$. For the actual determination of the relationship between the temperature T and the carrier emission rate $e_n$ from the exponential function (1), there have been available the methods known as DLTS (Deep Level Transient Spectroscopy) and ICTS (Isothermal Capacitance Transient Spectroscopy).

ICTS is a process for determining the carrier emission rate $e_n$ at a temperature T, given as a set condition, as shown in the flowchart of FIG. 1 in the accompanying drawings. Specifically, at a temperature T, the waveform of a response is continuously recorded from the time a step input is applied, and a time $t_{max}$ is found where the product of the differential coefficient derivative after t seconds and the time t is a maximum (of a peak value), with the reciprocal of the time $t_{max}$ thus found being determined as the carrier emission rate $e_n$.

According to DLTS, a temperature T for achieving a carrier emission rate $e_n$, given as a set condition, is determined as shown in the flowchart of FIG. 2 in the accompanying drawings. Actually, a certain time window $t_w (=1/e_n)$ is selected, and the product of the differential coefficient derivative of the response waveform at the time and t is recorded while the temperature T varies in order to find the temperature $T_{max}$ where the signal indicative of the product is a maximum (of a peak value).

In either DLTS or ICTS, it has been customary to vary the condition a plurality of times (the temperature T for ICTS and the time window $t_w$ for DLTS) to grasp the relationship between the carrier emission rate $e_n$ and the temperature T for obtaining parameters of the deep level using equation (2). Finally, parameters such as $E_T$, $\sigma_n$, etc. are compared with those of the literature to identify the deep level.

However, the conventional measurements using DLTS or ICTS have been complex as it is necessary to repeat the setting of the condition and the sweeping of the temperatures to determine the peak a plurality of times.

According to DLTS or ICTS, a spectral maximum (peak) must be determined on the assumption that the response waveform is represented by an exponential function. Such a procedure is easy if the device being measured contains a very distinct, single deep level. However, if the device being measured contains a plurality of deep levels or a peak is not distinct but spread, the above procedure cannot easily be accomplished. To determine an activation energy or the like from spectra measured under different set conditions, it has been necessary to correlate the peaks of the spectra correctly with each other. In reality, when the energy of a deep level is determined according to equation (2), a large error of up to 0.2 eV, for example, may be produced, resulting in incorrect identification of the deep level.

SUMMARY OF THE INVENTION

It is an object of the present invention to provide a waveform displaying method and a waveform analyzing apparatus which are capable of measuring and identifying a deep level in a device reliably, accurately, and quickly.

According to an aspect of the present invention, there is provided a method of displaying a waveform of a response, variable with time, of an output characteristic from a terminal of a semiconductor device in response to a step voltage applied to a terminal thereof, comprising the steps of measuring and recording the product of a time t and a derivative with respect to time of the wave form of a response of the output characteristic after the elapse of time t from the application of the step voltage at each of a plurality of temperatures T, and displaying the recorded products three-dimensionally in a space coordinate system having a first axis representing the reciprocals of the temperatures T, a second axis representing the logarithms of the products of the squares of the temperatures T and the time t, and a third axis representing the product of the derivatives and the time t.

According to another aspect of the present invention, there is provided a method of displaying a waveform of a response, variable with time, of a current from a terminal of a diode or a transistor mounted on a substrate in response to a step voltage applied to a terminal thereof, comprising the steps of measuring and recording the product of a time t and a derivative, with respect to time, of the waveform of a response of the current after the elapse of time t from the application of the step voltage at each of a plurality of temperatures T, and displaying the recorded products three-dimensionally in a space coordinate system having a first axis representing the reciprocals of the temperatures T, a second axis representing the logarithms of the products of the squares of the temperatures T and time t, and a third axis representing the product of the derivatives and the time t.

According to still another aspect of the present invention, there is provided a method of displaying a waveform of a response, variable with time, of a capacitance between two terminals of a diode or a transistor mounted on a substrate in response to a step voltage applied to a terminal thereof, comprising the steps of measuring and recording the product of a time t and a derivative, with respect to time, of the waveform of a response of the capacitance after the elapse of time t from the application of the step voltage at each of a plurality of temperatures T, and displaying the recorded products three-dimensionally in a space coordinate system having a first axis representing the reciprocals of the temperatures T, a second axis representing the logarithms of the products of the squares of the temperatures T and the time t, and a third axis representing the product of the derivatives and the time t.

According to yet another aspect of the present invention, there is provided a method of displaying a waveform of a response, variable with time, of a voltage at a terminal of a diode or a transistor mounted on a substrate, which voltage is to be applied to keep a current from a terminal thereof at a certain level in response to a step voltage applied to a terminal thereof, comprising the steps of measuring and recording the product of a time t and a derivative, with respect to time, of the waveform of a response of the voltage after the elapse of time t from the application of the step voltage at each of a plurality of temperatures T, and displaying the recorded products three-dimensionally in a space coordinate system having a first axis representing the reciprocals of the temperatures T, a second axis representing the logarithms of the products of the squares of the temperatures T and the time t, and a third axis representing the product of the derivatives and the time t.

According to a further aspect of the present invention, there is provided an apparatus for analyzing a waveform of a response, variable with time, of a voltage at a first terminal of a semiconductor device comprising a diode or a transistor mounted on a substrate in response to a step voltage applied to a second terminal of the semiconductor device, comprising a step voltage generator for generating the step voltage to be applied to the second terminal of the semiconductor device, an analog-to-digital converter for converting the voltage at the first terminal of the semiconductor device into a digital signal when the step voltage is applied to the second terminal, a temperature regulator for adjusting the temperature of the semiconductor device, a computer for controlling the step voltage generator used to generate the step voltage and the temperature regulator used to control the temperature of the semiconductor device, recognizing the digital signal from the analog-to-digital converter as the waveform of the response of the voltage, and generating a display signal based on the waveform of the response by storing the product of a time t and a derivative, with respect to time, of the waveform of the response after the elapse of time t from the application of the step voltage to the second terminal at each of a plurality of temperatures T, the display signal indicating the stored products three-dimensionally in a space coordinate system having a first axis representing the reciprocals of the temperatures T, a second axis representing the logarithms of the products of the squares of the temperatures T and the time t, and a third axis representing the product of the derivatives and the time t, and display means for displaying the display signal from the computer.

According to a still further aspect of the present invention, there is provided an apparatus for analyzing a waveform of a response, variable with time, of a current from a first terminal of a semiconductor device comprising a diode or a transistor mounted on a substrate in response to a step voltage applied to a second terminal of the semiconductor device or the substrate, comprising a step voltage generator for generating the step voltage to be applied to the second terminal of the semiconductor device, a current-to-voltage converter for converting the current from the first terminal into a voltage when the step voltage is applied to the second terminal, an analog-to-digital converter for converting the voltage from the current-to-voltage converter into a digital signal, a temperature regulator for adjusting the temperature of the semiconductor device, a computer for controlling the step voltage generator used to generate the step voltage and the temperature regulator used to control the temperature of the semiconductor device, recognizing the digital signal from the analog-to-digital converter as the waveform of the response of the voltage, and generating a display signal based on the waveform of the response by storing the product of a time t and a derivative, with respect to time, of the waveform of the response after elapse of time t from the application of the step voltage to the second terminal at each of a plurality of temperatures T, the display signal indicating the stored products three-dimensionally in a space coordinate system having a first axis representing the reciprocals of the temperatures T, a second axis representing the logarithms of the products of the squares of the temperatures T and the time t, and a third axis representing the product of the derivatives and the time t, and display means for displaying the display signal from the computer.

According to a yet further aspect of the present invention, there is provided an apparatus for analyzing a waveform of a response, variable with time, indicated by a capacitance between two terminals of a semiconductor device comprising a diode or a transistor mounted on a substrate in response to a step voltage applied to a terminal of the semiconductor device or the substrate, comprising a step voltage generator for generating the step voltage to be applied to the terminal of the semiconductor device, a current-to-voltage converter for converting the capacitance between the two terminals into a voltage when the step voltage is applied to the terminal of the semiconductor device or the substrate, an analog-to-digital converter for converting the voltage from the current-to-voltage converter into a digital signal, a temperature regulator for adjusting the temperature of the semiconductor device, a computer for controlling the step voltage generator used to generate the step voltage and the temperature regulator used to control the temperature of the semiconductor device, recognizing the digital signal from the analog-to-digital converter as the waveform of the response of the voltage, and generating a display signal based on the waveform of the response by storing the product of a time t and a derivative, with respect to time, of the waveform of the response after the elapse of time t from the application of the step voltage to the second terminal at each of a plurality of temperatures T, the display signal indicating the stored products three-dimensionally in a space coordinate system having a first axis representing the reciprocals of the temperatures T, a second axis representing the logarithms of the products of the squares of the temperatures T and the time t, and a third axis representing the product of the derivatives and the time t, and display means for displaying the display signal from the computer.

The above and other objects, features, and advantages of the present invention will become apparent from the following description when taken in conjunction with the accompanying drawings which illustrate a preferred embodiment of the present invention by way of example.

BRIEF DESCRIPTION OF THE DRAWINGS

FIG. 3 is a diagram of the waveforms of input and output signals of a device;

DETAILED DESCRIPTION OF THE PREFERRED EMBODIMENTS

Figure 1:
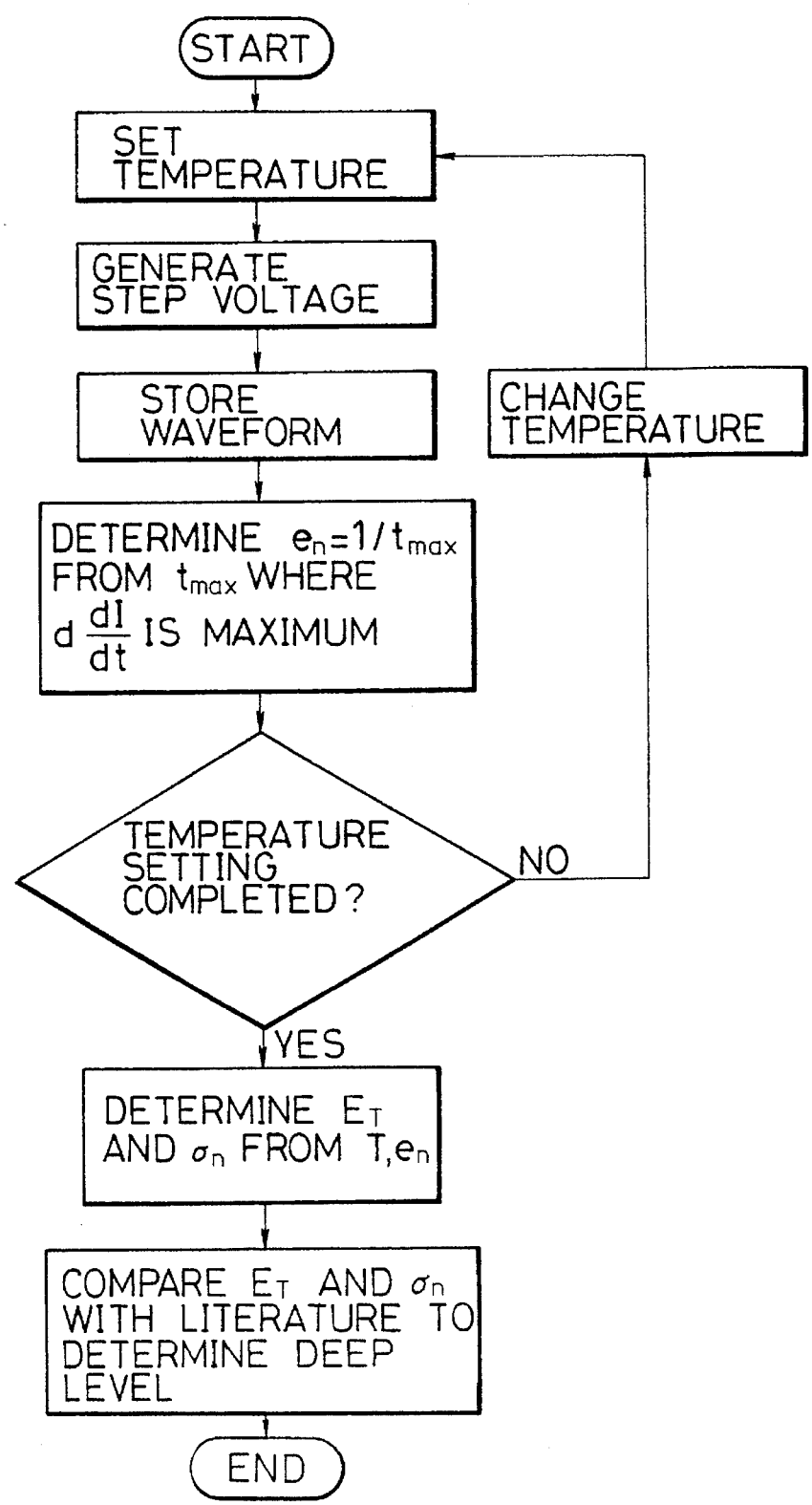
FIG. 1 is a flowchart of the conventional ICTS process.
Figure 2:
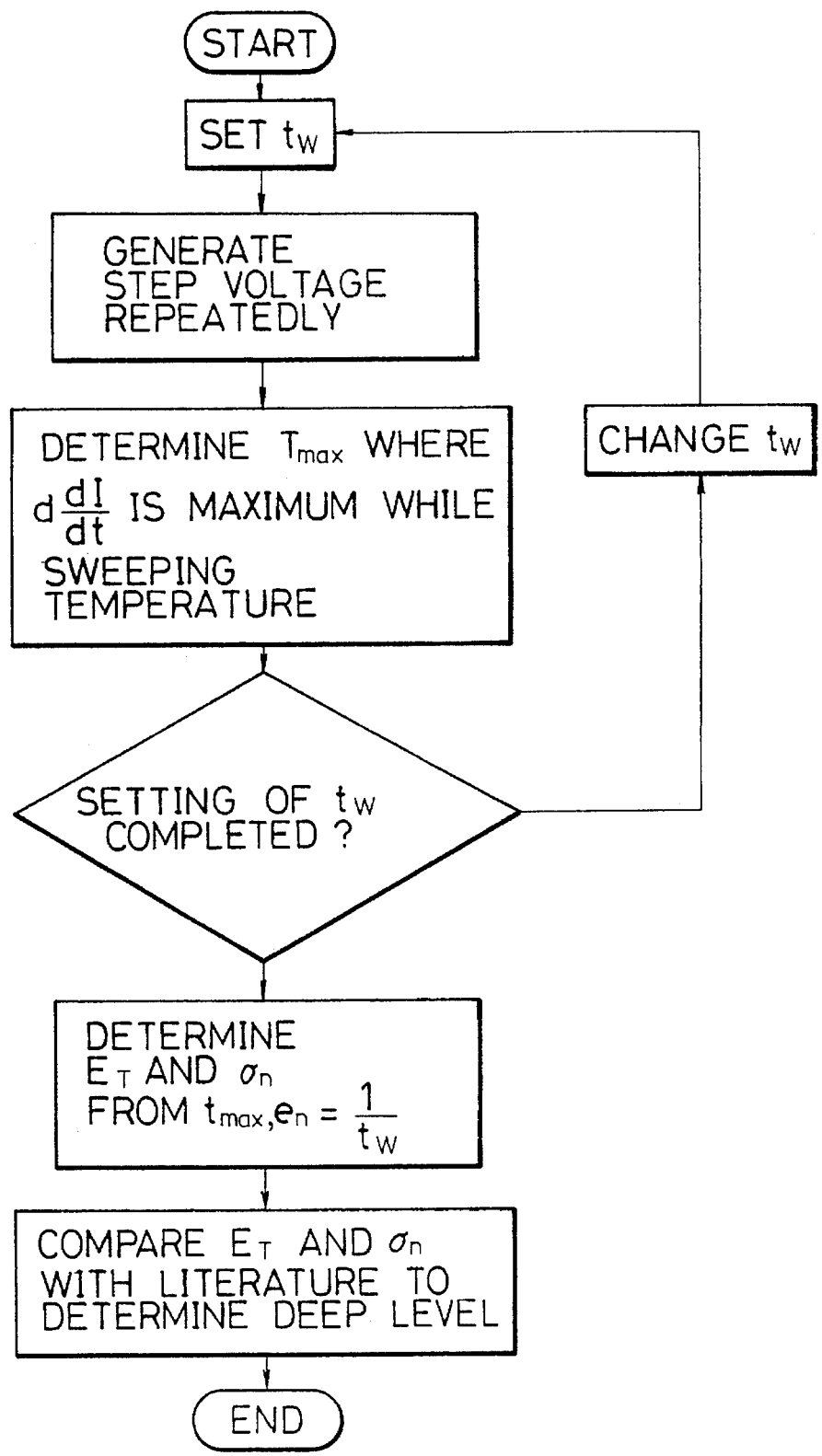
FIG. 2 is a flowchart of the conventional DLTS process.

When a voltage that varies in a step-like manner as shown in FIG. 3 is applied to a device, if a current flowing through the device or another characteristic value thereof varies due to the emission of a carrier from a deep level in the device, the response of the current or other characteristic value can be expressed by:

$$\exp(-e_n t) \quad (3)$$

where $e_n$ is the carrier emission rate and t is time. When the above function is differentiated with respect to t and then multiplied by t, we obtain:

$$e_n t \cdot \exp(-e_n t) \quad (4)$$

The function (4) has a maximum value (peak) when $e_n t = 1$. The time t when the function (4) has a maximum value is given by:

$$t_{max} = 1/e_n \quad (5)$$

As described above with reference to equation (2), the carrier emission rate $e_n$ is related to the temperature T according to the following equation:

$$e_n = C_1 \cdot T^2 \cdot \exp\{-E_T/kT\} \quad (6)$$

where $C_1$ is a constant and equal to $N_c v_{th} \sigma_n$. Therefore, from equations (5) and (6) we have $$\log(t_{max} T^2) = E_T/kT + C_2 \quad (7)$$

where $C_2$ is a constant and equal to $-\log(N_c v_{th} \sigma_n)$.

Figure 4:
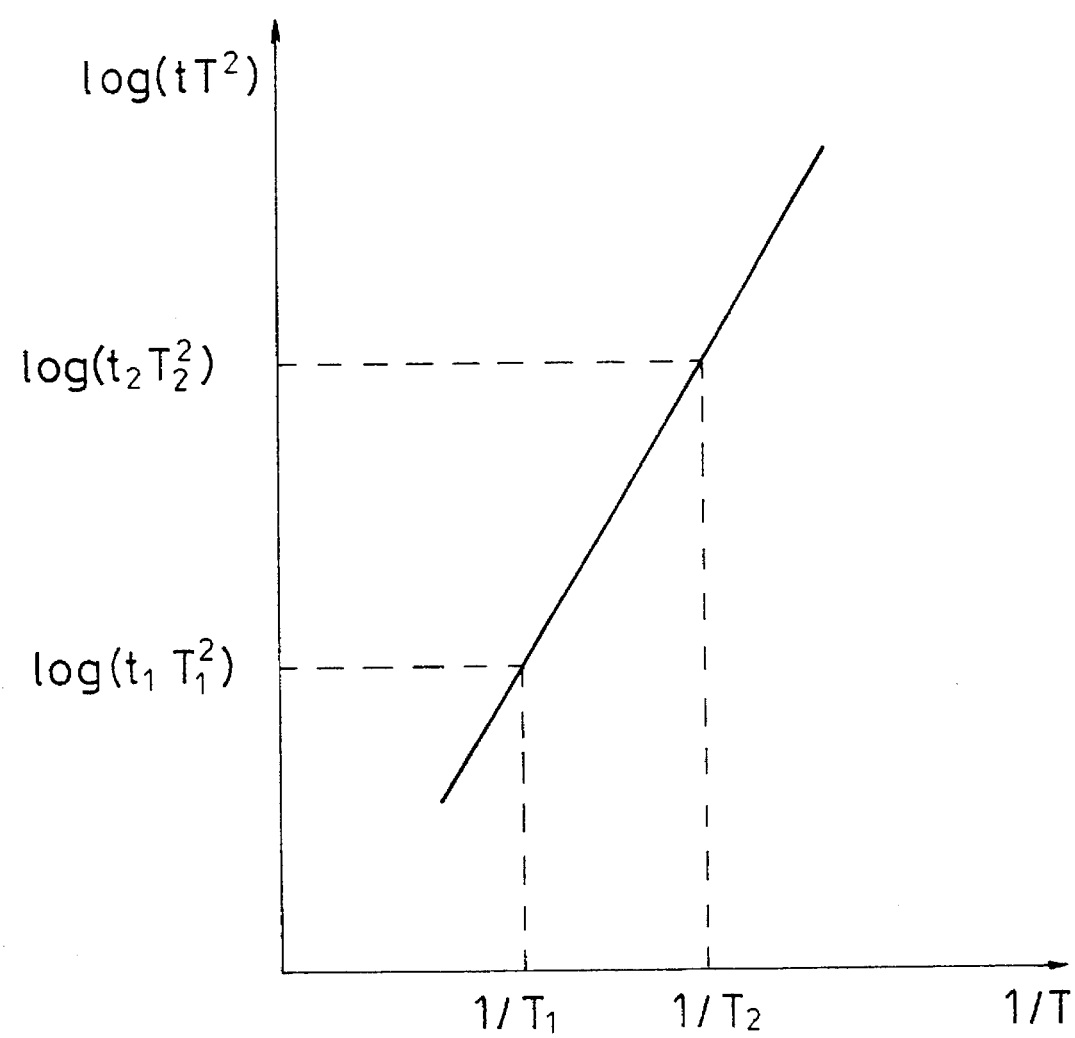
FIG. 4 is a graph showing the relationship between a time $t_{max}$ which is a peak shown in FIG. 3 and a temperature T.

Equation (7) above represents the relationship between the time $t_{max}$ and the temperature T. If, as shown in FIG. 4, a rectangular plane coordinate system has a first axis (x-axis) representing $1/T$ and a second axis (y-axis) representing $\log(tT^2)$, coordinates corresponding to $t_{max}$ should be on a straight line in the plane of the coordinate system.

Figure 5:
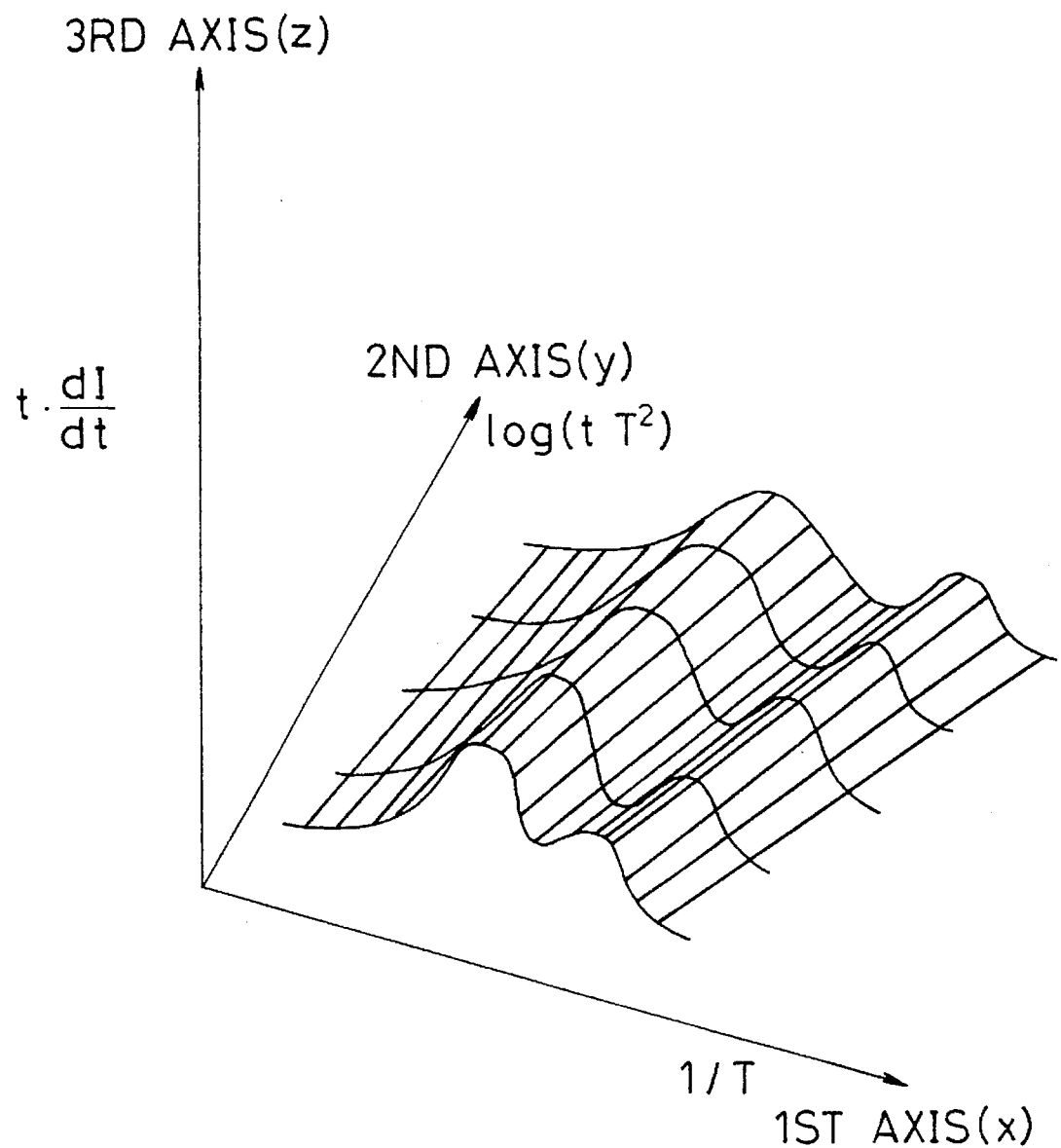
FIG. 5 is a graph showing the three-dimensional output graphic image produced by a waveform displaying method according to the present invention.
Figure 9:
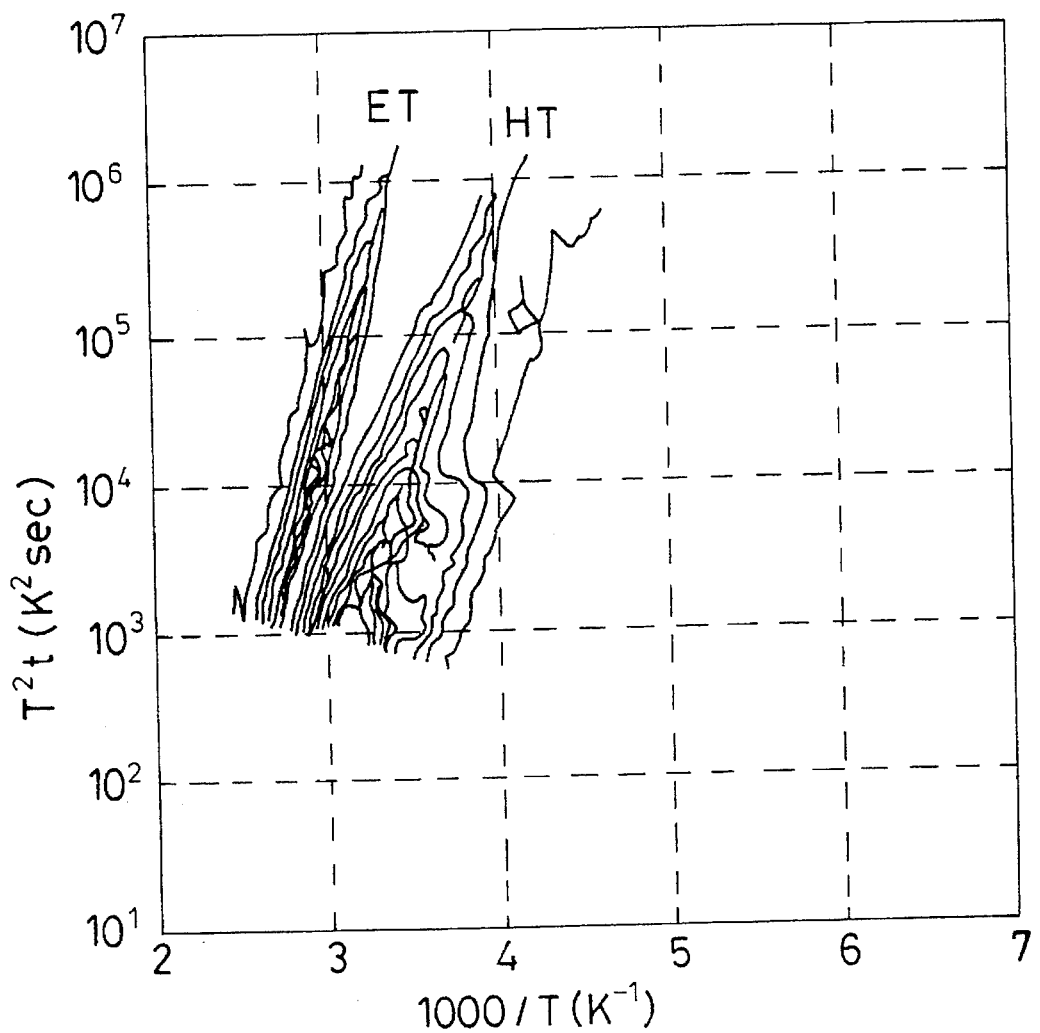
FIG. 9 is a diagram showing the contour-line output graphic image produced by the waveform displaying method according to the present invention.

Next, a orthogonal space coordinate system as shown in FIG. 5 is considered. If the measured values of the function (4) are represented by a third axis (z-axis) with the first and second axes (x- and y-axes) being the same as those shown in FIG. 4, the maximum values of the function (4) should be three-dimensionally plotted successively as a ridge with respect to the values of the first and second axes. A plurality of deep levels, if any, will correspond to different ridges plotted in the space coordinate system. The three-dimensional plot shown in FIG. 5 may also be indicated by contour lines on the plane represented by the first and second axes as shown in FIG. 9. When straight lines corresponding to the equation (7) are plotted on the plane as shown in FIG. 9 based on the values of the activation energy $E_T$ and the capture cross-section $\sigma_n$ which are found in the past literature, it is possible to easily identify deep levels that are highly likely to correspond to the above ridges.

A computer system may be designed to allow the operator to enter certain values of $E_T$ and $\sigma_n$ through a keyboard, display straight lines generated based on the entered values according to equation (7) in an overlapping relationship to the displayed data as shown in FIG. 9, and also display again straight lines based on updated values of $E_T$ and $\sigma_n$. Using such a computer system, the operator can easily obtain straight lines along ridges and values of $E_T$ and $\sigma_n$ of corresponding deep levels on a trial-and-error basis. The values of $E_T$ and $\sigma_n$ may easily be entered and updated by the operator using a suitable input device such as a joystick connected to the computer. The latest values of $E_T$ and $\sigma_n$ that are entered may be displayed as numerals on part of the display screen so that the operator can easily confirm the entered values visually.

In FIGS. 6 through 12, the device characteristic which responds to an input voltage and is variable with time is current.

Figure 6:
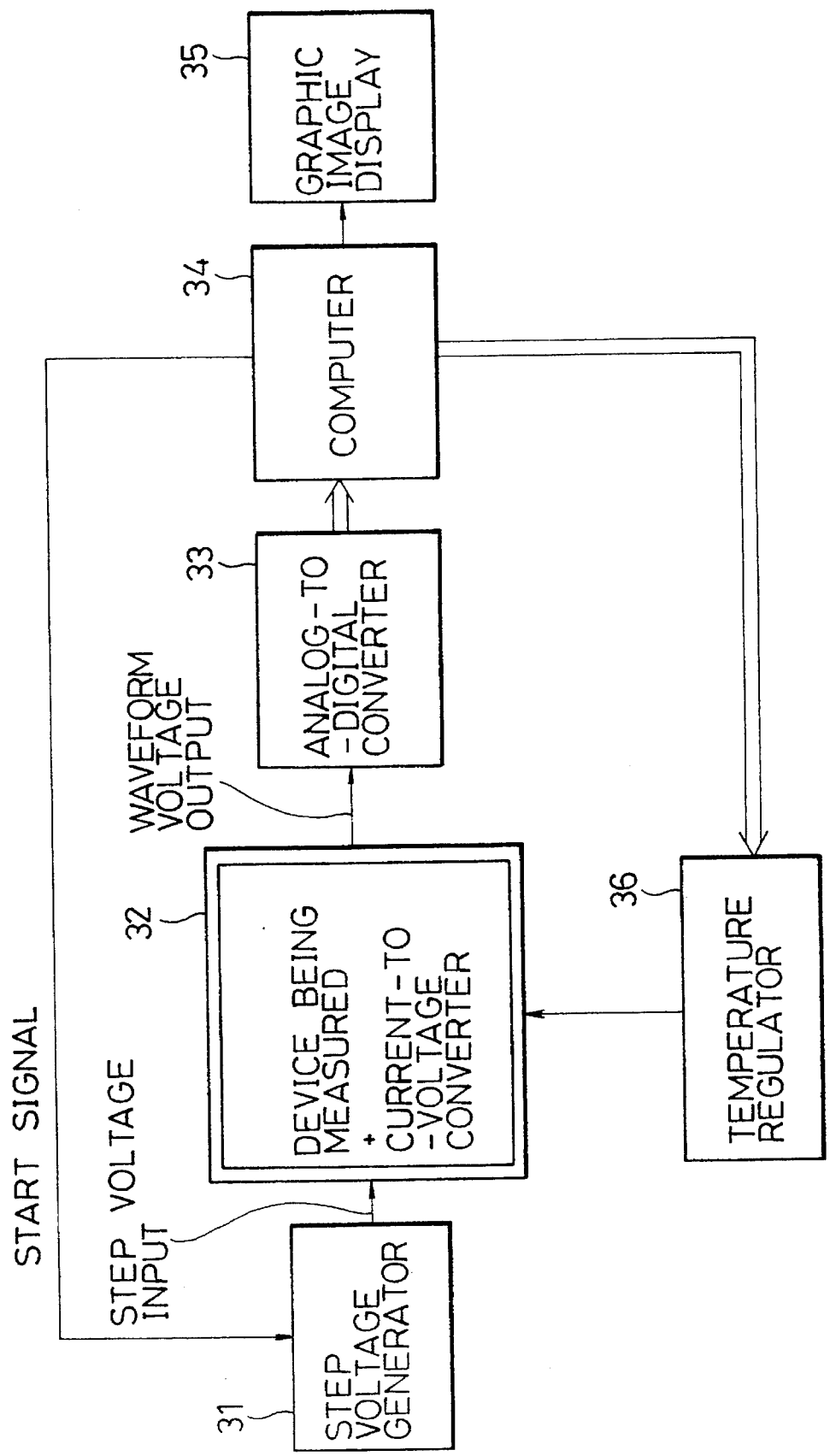
FIG. 6 is a block diagram of the waveform analyzing apparatus according to the present invention.

FIG. 6 shows in block form a waveform analyzing apparatus according to the present invention. A block 32, indicated by a double line, is a device being measured and a circuit for converting a device characteristic such as current capacitance, or the like into voltage. A step voltage is applied to the block 32 by a step voltage generator 31, and an output voltage from the block 32 which is indicative of the waveform of a response of the device is converted by an analog-to-digital converter 33 into a digital signal which is supplied to a computer 34. The temperature of the block 32 is controlled by a temperature regulator 36 which is supplied with a temperature setting from the computer 34. The step voltage generator 31 is supplied with a start signal for starting generation of a step voltage from the computer 34. A graphic image display 35 is connected to the computer 34 for displaying a three-dimensional graphic image of analyzed data based on a display signal from the computer 34.

Figure 7:
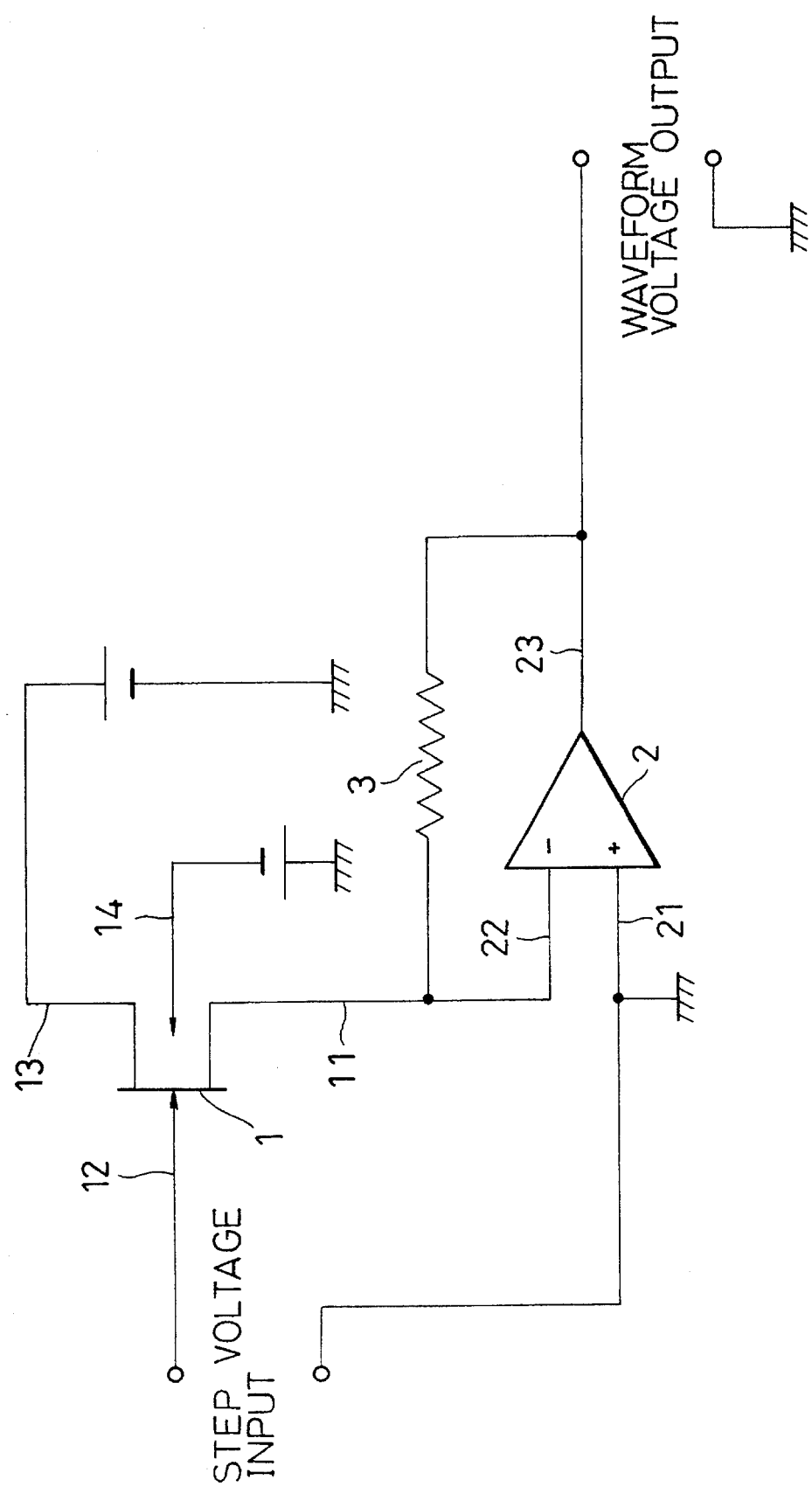
FIG. 7 is a circuit diagram of the device being measured and associated circuit elements.

The block 32 shown in FIG. 6 is shown in specific detail in FIG. 7. In FIG. 7, the device being measured is a field-effect transistor (FET) indicated by the reference numeral 1, and the device characteristic that responds to the input step voltage and is variable with time is current. When the step voltage is applied to a gate terminal 12 of the FET 1, the waveform of a source current of the FET 1 which responds to the applied step voltage and is variable with time is analyzed for the evaluation of a phenomenon usually called "gate lag." The FET 1 has a source terminal 11 connected to an operational amplifier 2 for converting a current change into a voltage change while a constant voltage is being applied. The operational amplifier 2 has a noninverting input terminal 21 grounded, an inverting input terminal 22 connected to the source terminal 11, and an output terminal 23 connected through a resistor 3 to the source terminal 11. The FET 1 has a drain terminal 13 kept at a constant potential and a substrate terminal 14 also kept at a constant potential. A voltage waveform proportional to a current from the source terminal 11 appears on the output terminal 23 of the operational amplifier 2.

Figure 8:
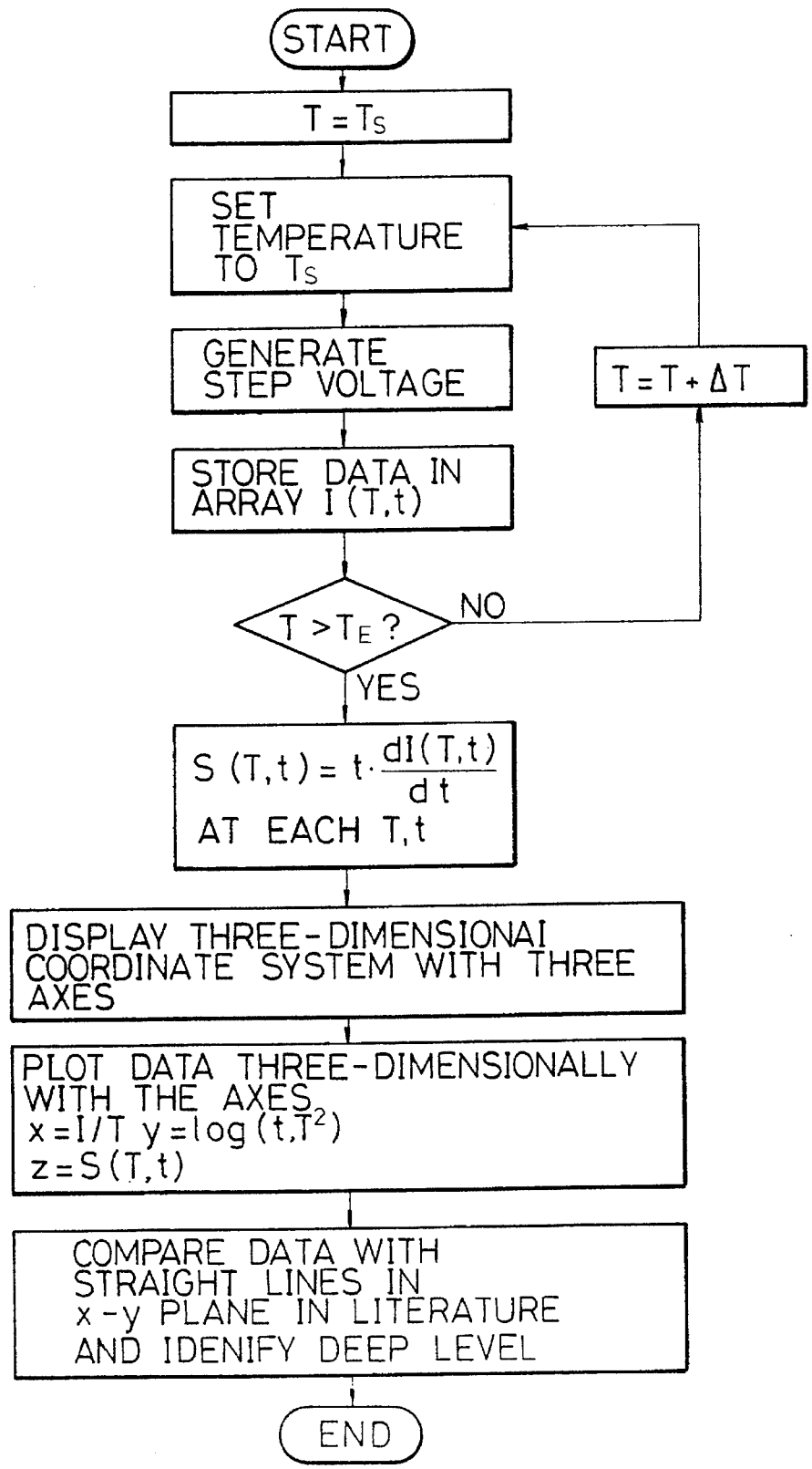
FIG. 8 is a flowchart of the operation sequence of a computer in the waveform analyzing apparatus shown in FIG. 6.

FIG. 8 shows a flowchart of a program or operation sequence executed by the computer 34. As shown in FIG. 8, the temperature T for measurements is set successively at intervals of $\Delta T$ from $T_S$ to $T_E$. At each temperature, the step voltage is generated and the waveform of the response is then stored as a two-dimensional array of data I (T, t), where t is the time that has elapsed from the input of the step voltage. After the measurements, the function I (T, t) is differentiated with respect to t and multiplied by t for every value of T and t, and the results are substituted in the two-dimensional array of data S (T, t). Finally, the data is three-dimensionally displayed in a orthogonal space coordinate system having a first axis (x-axis) indicative of 1/T, a second axis (y-axis) of $\log(tT^2)$, and a third axis (z-axis) of S (T, t).

As a result, the graphic image display 35 displays a three-dimensional graphic image as shown in FIG. 5. Each of the curves extending along the first axis in FIG. 5 corresponds to data obtained according to conventional DLTS. Since these curves are three-dimensionally displayed, the peak positions can be clearly indicated. The three-dimensional information shown in FIG. 5 may be displayed by contour lines as shown in FIG. 9, in which the data correspond to two deep levels in the device and two ridges are consequently displayed.

Figure 10:
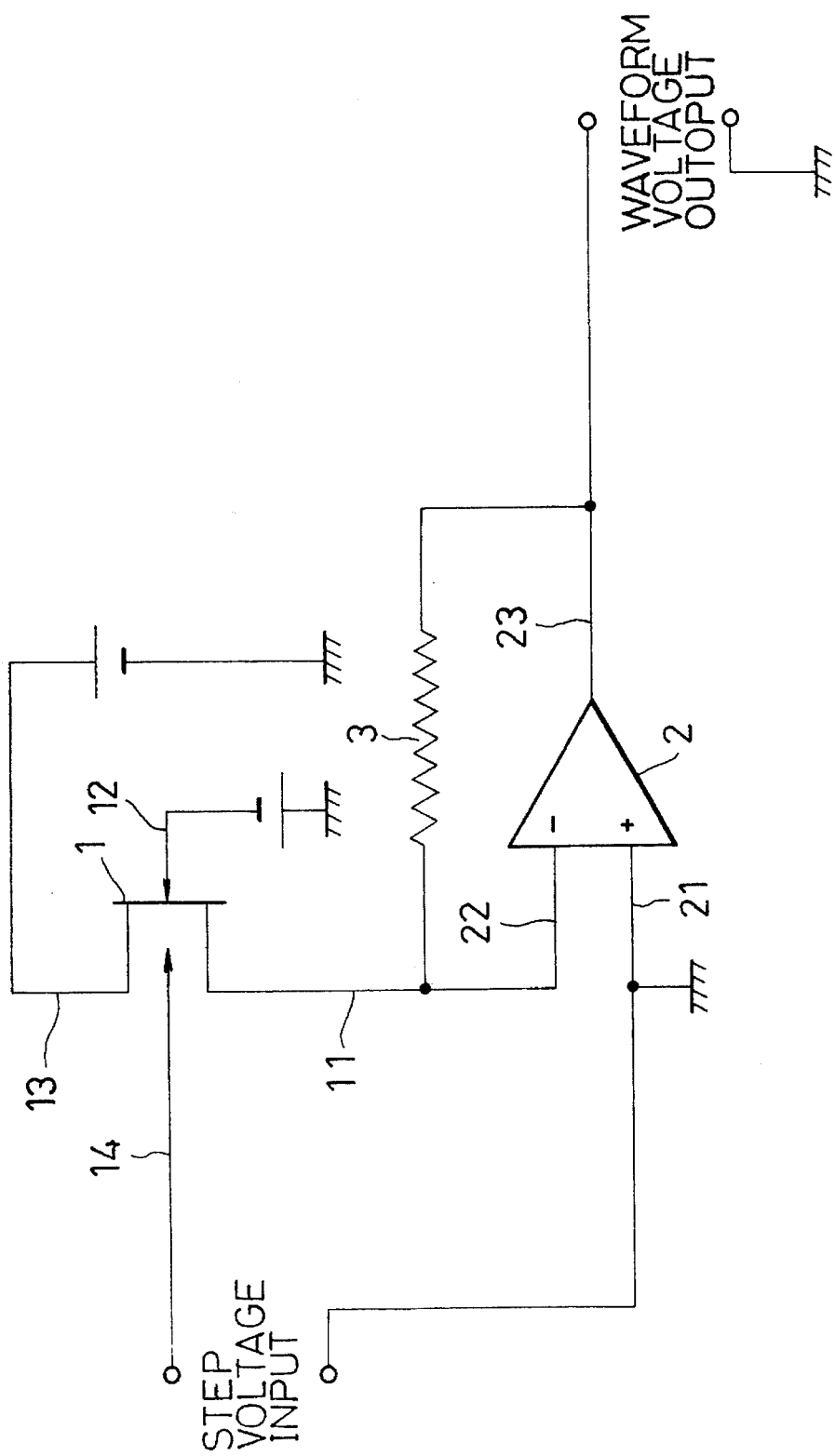
FIGS. 10 through 16 are circuit diagrams of the different devices being measured and associated circuit elements.

FIG. 10 shows a device being measured and associated circuit elements. In FIG. 10, when a step voltage is applied to a substrate terminal 14 of an FET 1, the waveform of a source current of the FET 1 which responds to the applied step voltage and is variable with time is analyzed for the evaluation of a phenomenon usually called "side gating effect." The FET 1 has a source terminal 11 connected to an operational amplifier 2 for converting a current change into a voltage change while a constant voltage is being applied. The operational amplifier 2 has a noninverting input terminal 21 grounded, an inverting input terminal 22 connected to the source terminal 11, and an output terminal 23 connected through a resistor 3 to the source terminal 11. The FET 1 has a drain terminal 13 kept at a constant potential and a gate terminal 12 also kept at a constant potential. A voltage waveform proportional to a current from the source terminal 11 appears on the output terminal 23 of the operational amplifier 2. The circuit shown in FIG. 10 may be incorporated in the apparatus shown in FIG. 6 for carrying out measurements and calculations according to the program shown in FIG. 8 to display three-dimensional data as shown in FIG. 5.

Figure 11:
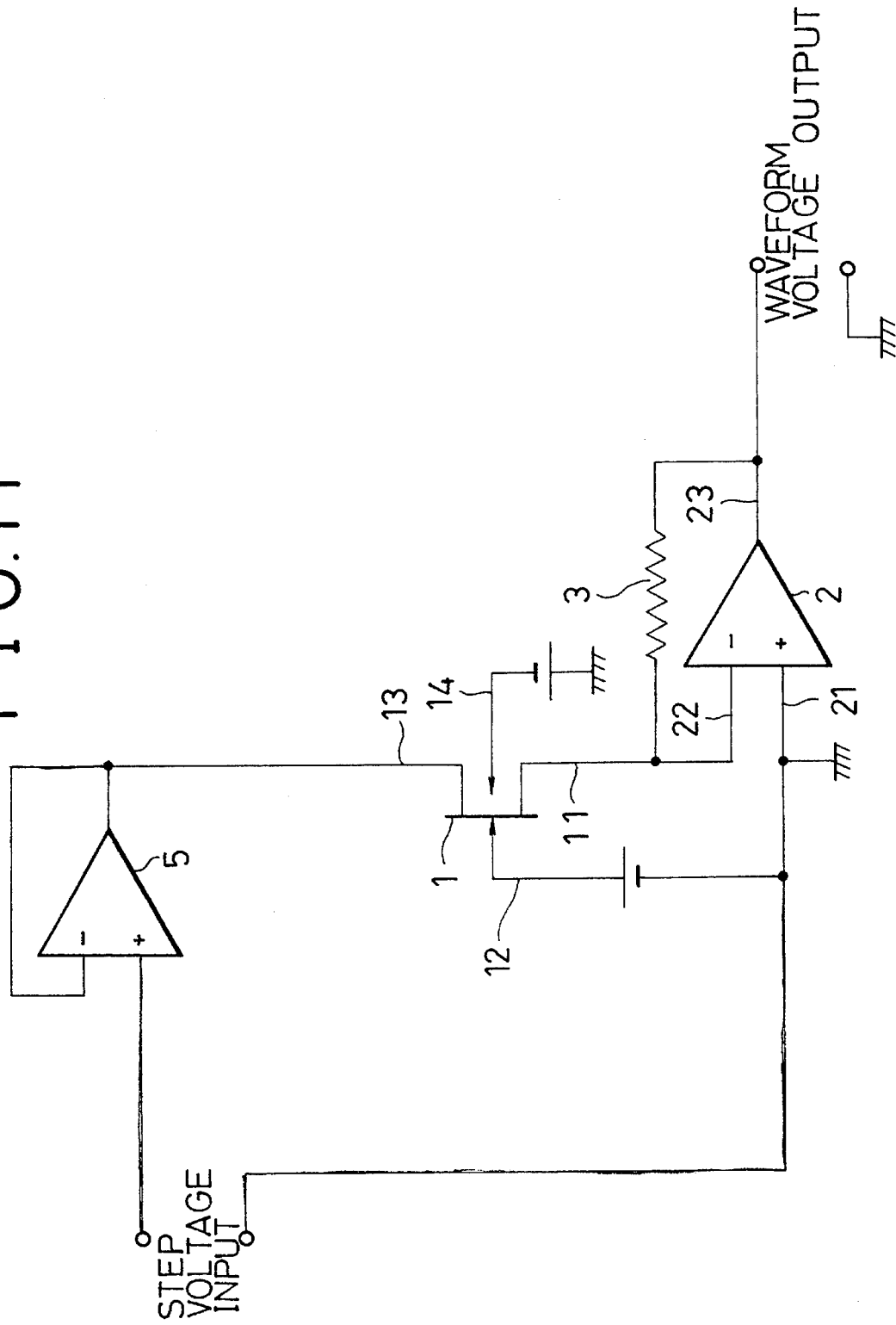

FIG. 11 shows another device being measured and associated circuit elements. In FIG. 11, when a step voltage is applied to a drain terminal 13 of an FET 1, the waveform of a source current of the FET 1 which responds to the applied step voltage and is variable with time is analyzed for the evaluation of a phenomenon usually called "drain lag." The FET 1 has a source terminal 11 connected to an operational amplifier 2 for converting a current change into a voltage change while a constant voltage is being applied. The operational amplifier 2 has a noninverting input terminal 21 grounded, an inverting input terminal 22 connected to the source terminal 11, and an output terminal 23 connected through a resistor 3 to the source terminal 11. The applied step voltage is supplied through an operational amplifier 5 used as a buffer to a drain terminal 13 of the FET 1. The FET 1 has a gate terminal 12 kept at a constant potential and a substrate terminal 14 that is also kept at a constant potential. A voltage waveform proportional to a current from the source terminal 11 appears on the output terminal 23 of the operational amplifier 2. The circuit shown in FIG. 11 may be incorporated in the apparatus shown in FIG. 6 for carrying out measurements and calculations according to the program shown in FIG. 8 to display three-dimensional data as shown in FIG. 5.

Figure 12:
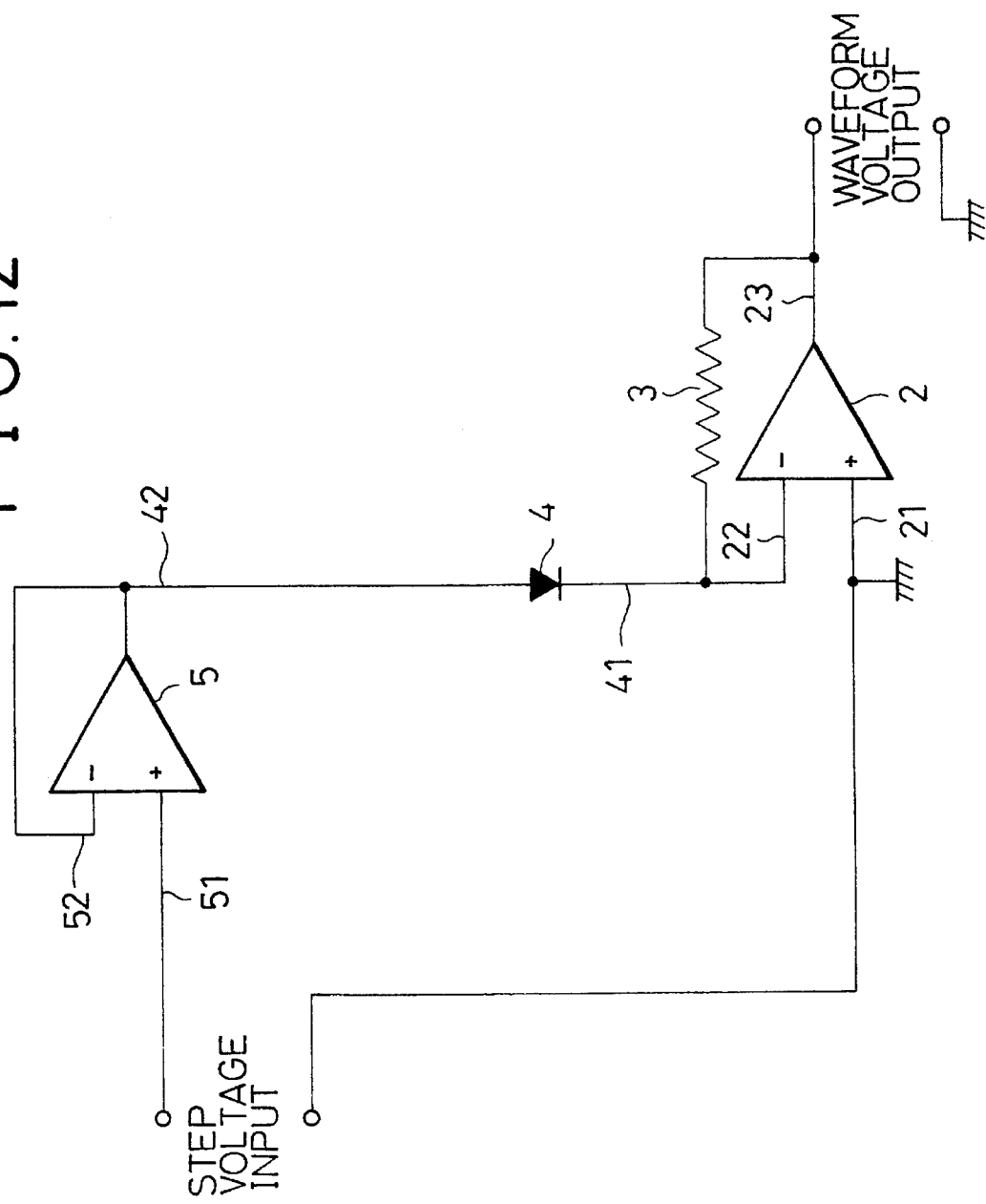

FIG. 12 shows still another device being measured and associated circuit elements. In FIG. 12, the device being measured comprises a diode. When a step voltage is applied to an anode terminal 42 of a diode 4, the wave-form of a current from a cathode terminal 41 thereof, which waveform responds to the applied step voltage and is variable with time, is analyzed. To the cathode terminal 41, there is connected an operational amplifier 2 for converting a current change into a voltage change while a constant voltage is being applied. The operational amplifier 2 has a noninverting input terminal 21 grounded, an inverting input terminal 22 connected to the cathode terminal 41, and an output terminal 23 connected through a resistor 3 to the cathode terminal 41. The applied step voltage is supplied through an operational amplifier 5 used as a buffer to the anode terminal 42. The operational amplifier 5 has a noninverting input terminal 51 to which the step voltage is applied and an inverting input terminal 52 connected to the output terminal thereof, and hence, the anode terminal 41 of the diode 4. A voltage waveform proportional to a current from the cathode terminal 41 appears on the output terminal 23 of the operational amplifier 2. The circuit shown in FIG. 12 may be incorporated in the apparatus shown in FIG. 6 for carrying out measurements and calculations according to the program shown in FIG. 8 to display three-dimensional data as shown in FIG. 5.

Figure 13:
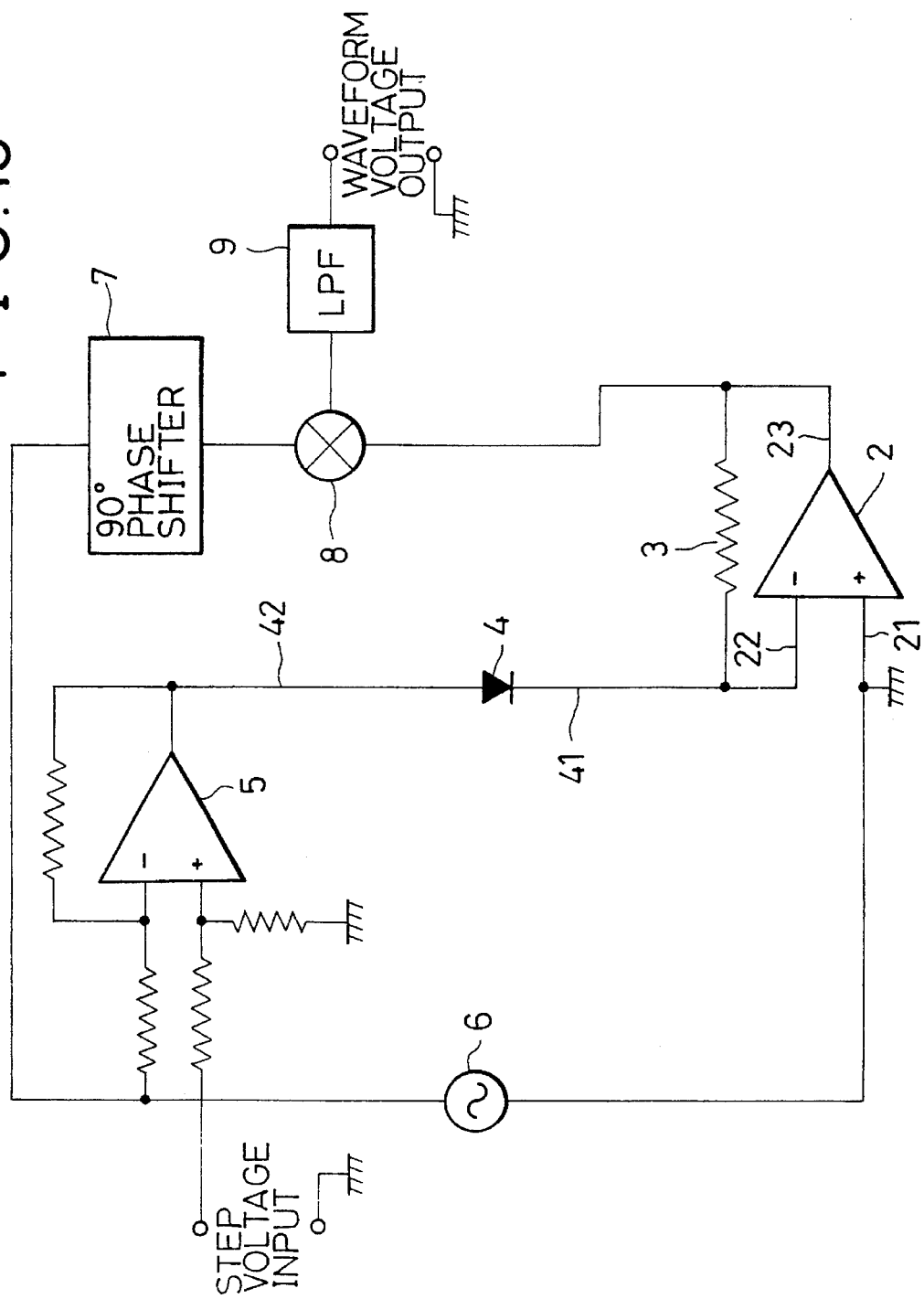
Figure 14:
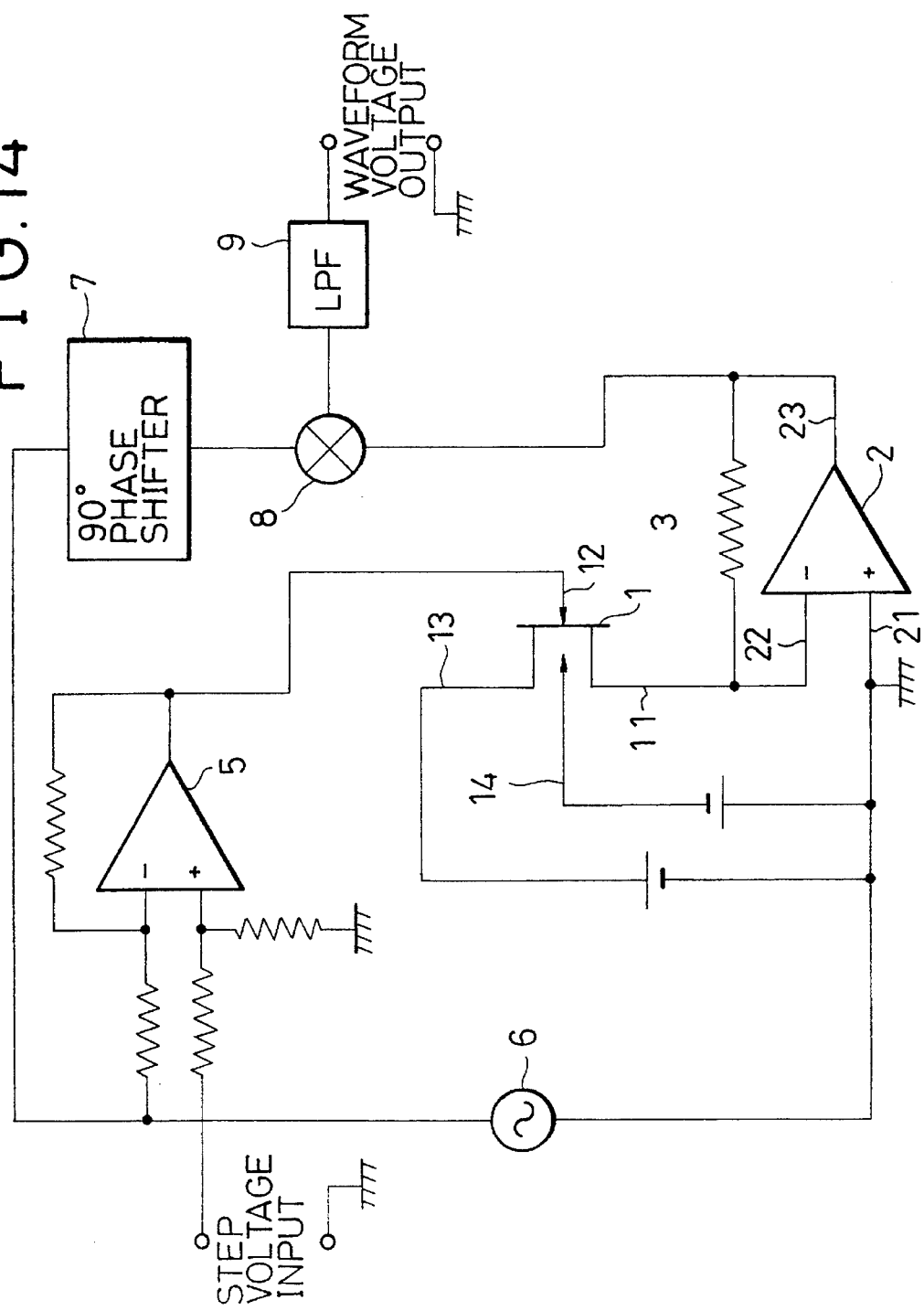

In FIGS. 13 and 14, the device characteristic which responds to an input voltage and is variable with time is capacitance.

FIG. 13 shows a device being measured and associated circuit elements. In FIG. 13, the device being measured comprises a diode. When a step voltage is applied to an anode terminal 42 of a diode 4, a waveform indicated by capacitance between the anode and cathode terminals of the diode 4, which waveform responds to the applied step voltage and is variable with time, is analyzed. To a cathode terminal 41 of the diode 4, there is connected an operational amplifier 2 for converting a current change into a voltage change while a constant voltage is being applied. The operational amplifier 2 has a noninverting input terminal 21 grounded, an inverting input terminal 22 connected to the cathode terminal 41, and an output terminal 23 connected through a resistor 3 to the cathode terminal 41. The applied step voltage, to which an AC signal having a frequency of about 1 MHz from an oscillator 6 is added by an operational amplifier 5, is supplied to the anode terminal 42, A voltage waveform proportional to a current from the cathode terminal 41 appears on the output terminal 23 of the operational amplifier 2. The phase of the AC signal from the oscillator 6 is shifted 90° by a phase shifter 7. The signal from the output terminal 23 is detected in phase by a detector 8 using the output signal from the phase shifter 7. The output signal from the phase detector 8 is passed through a low-pass filter 9 having a cutoff frequency of about 100 kHz. The low-pass filter 9 produces a voltage output proportional to the capacitance between the anode and cathode terminals 42, 41 of the diode 4. The circuit shown in FIG. 13 may be incorporated in the apparatus shown in FIG. 6 for carrying out measurements and calculations according to the program shown in FIG. 8 to display three-dimensional data as shown in FIG. 5.

FIG. 14 shows another device being measured and associated circuit elements. In FIG. 14, the device being measured is an FET. When a step voltage is applied to a gate terminal 12 of an FET 1, a waveform indicated by capacitance between the gate and source terminals of the FET 1, which waveform responds to the applied step voltage and is variable with time, is analyzed. The FET 1 has a source terminal 11 connected to an operational amplifier 2 for converting a current change into a voltage change while a constant voltage is being applied. The operational amplifier 2 has a noninverting input terminal 21 grounded, an inverting input terminal 22 connected to the source terminal 11, and an output terminal 23 connected through a resistor 3 to the source terminal 11. The FET 1 has a drain terminal 13 kept at a constant potential and a substrate terminal 14 also kept at a constant potential. The applied step voltage, to which an AC signal having a frequency of about 1 MHz from an oscillator 6 is added by an operational amplifier 5, is supplied to the gate terminal 12. A voltage waveform proportional to a current from the source terminal 11 appears on the output terminal 23 of the operational amplifier 2. The phase of the AC signal from the oscillator 6 is shifted 90° by a phase shifter 7. The signal from the output terminal 23 is detected in phase by a detector 8 using the output signal from the phase shifter 7. The output signal from the phase detector 8 is passed through a low-pass filter 9 having a cutoff frequency of about 100 kHz. The low-pass filter 9 produces a voltage output proportional to the capacitance between the gate and source terminals 12, 11 of the FET 1. The circuit shown in FIG. 14 may be incorporated in the apparatus shown in FIG. 6 for carrying out measurements and calculations according to the program shown in FIG. 8 to display three-dimensional data as shown in FIG. 5.

Figure 15:
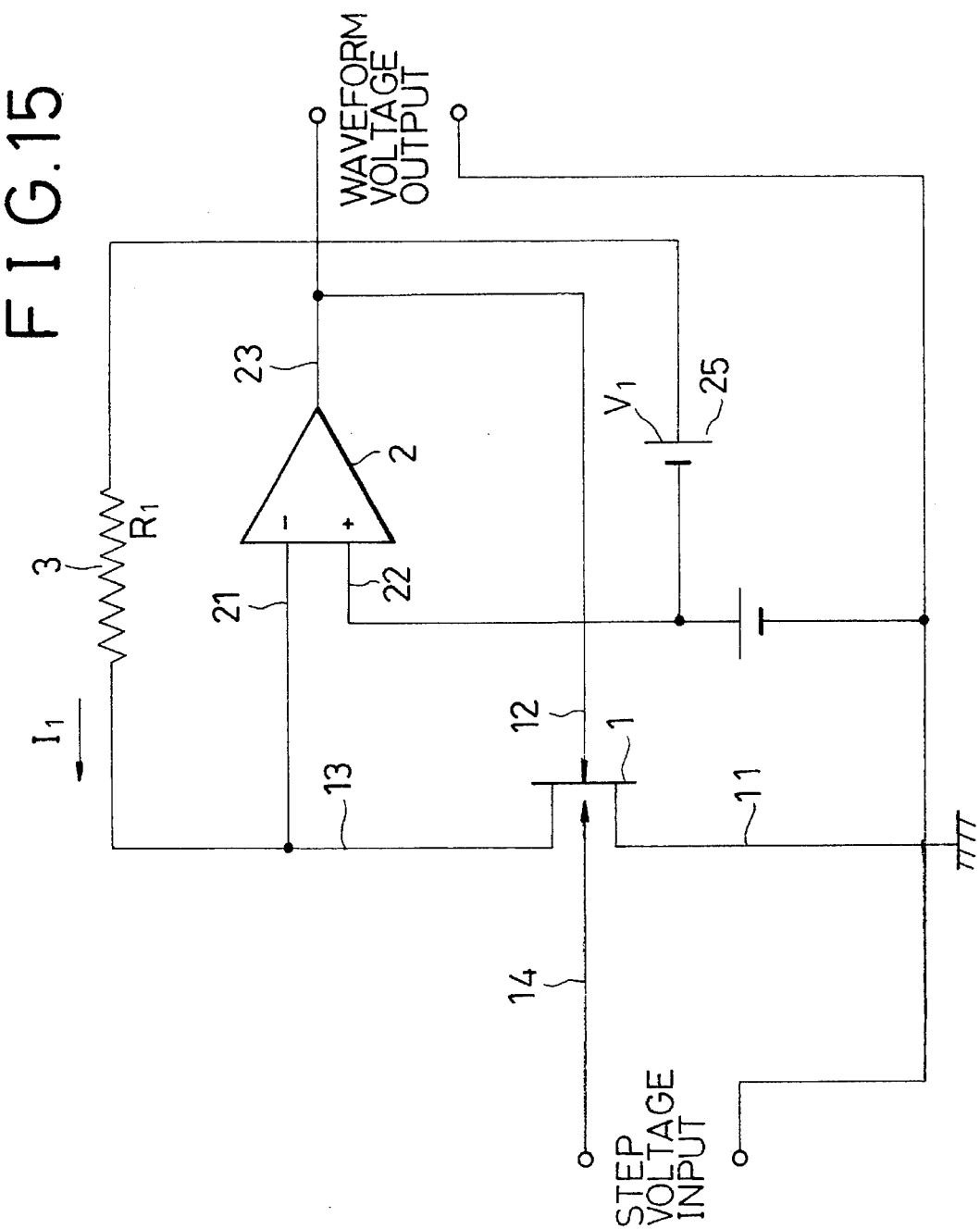
Figure 16:
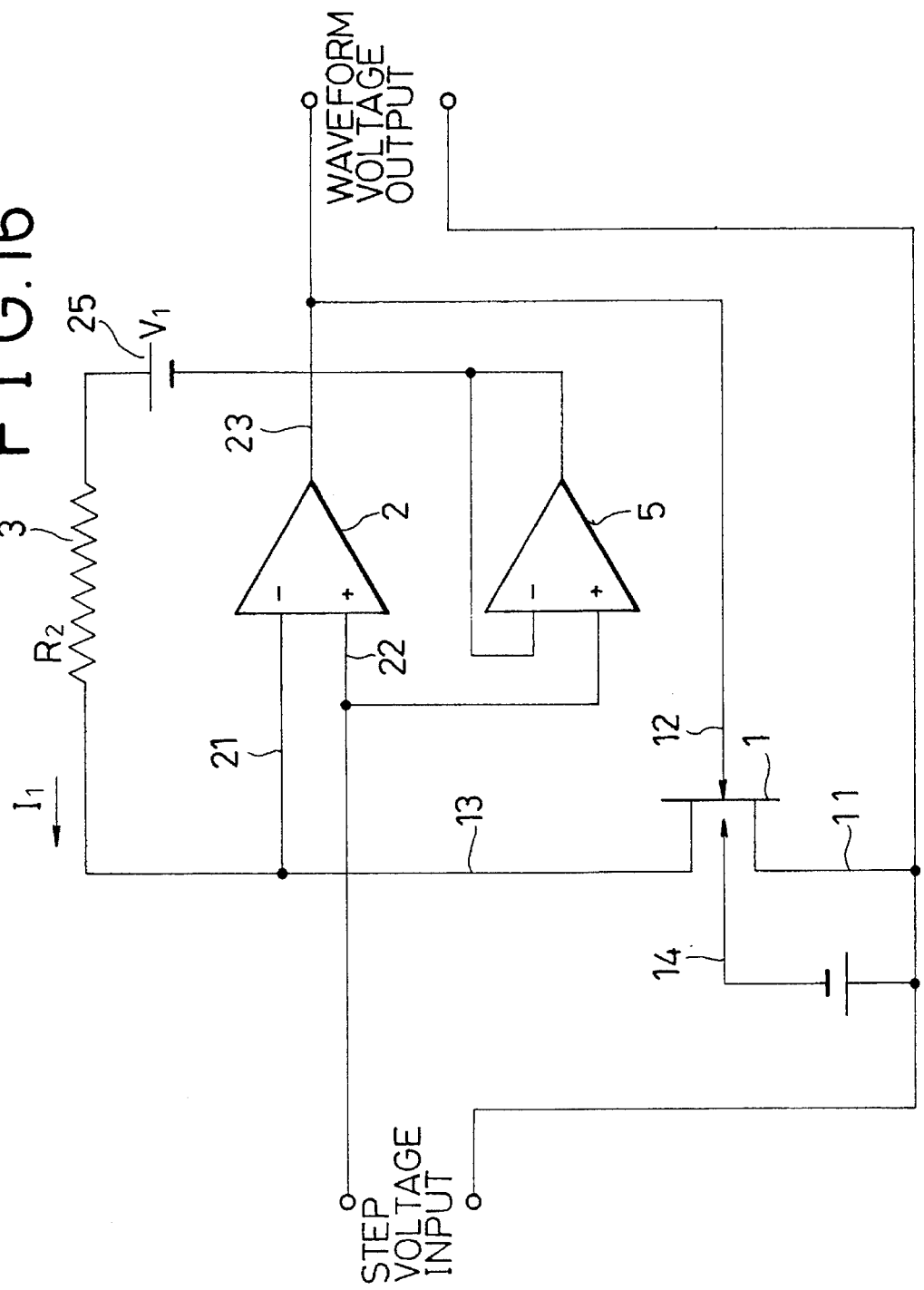

In FIGS. 15 and 16, the device characteristic which responds to an input voltage and is variable with time is a voltage at a terminal for keeping a current from a certain terminal at a constant level.

FIG. 15 shows a device being measured and associated circuit elements. In FIG. 15, the device being measured is an FET. When a step voltage is applied to a substrate terminal 14 of the FET 1, the waveform of a threshold voltage of the FET 1, i.e., the gate voltage which brings a drain current to a certain constant cutoff level, which waveform responds to the applied step voltage and is variable with time, is analyzed. The FET 1 has a drain terminal 13 to which a constant voltage is applied from a power supply 25 through a resistor 3. To the drain terminal 13, there is connected an operational amplifier 2 for monitoring variations in the drain voltage, i.e., variations in the drain current, to adjust the gate voltage to the threshold voltage. The operational amplifier 2 has a noninverting input terminal 21 connected to the drain terminal 13, an inverting input terminal 22 to which a constant voltage for controlling the drain voltage is applied, and an output terminal 23 connected to a gate terminal 12 of the FET 1. The voltage at the output terminal 23 is the threshold voltage of the FET 1. If it is assumed that the drain current (cutoff level) for controlling the threshold voltage of the FET 1 is indicated by $I_1$ and the power supply 25 has a voltage $V_1$, the resistance of the resistor 3 will then be indicated by $V_1/I_1$. The circuit shown in FIG. 15 may be incorporated in the apparatus shown in FIG. 6 for carrying out measurements and calculations according to the program shown in FIG. 8 to display three-dimensional data as shown in FIG. 5.

FIG. 16 shows another device being measured and associated circuit elements. In FIG. 16, the device being measured is an FET. When a step voltage is applied to a drain terminal 13 of the FET 1, the waveform of a threshold voltage of the FET 1, i.e., the gate voltage which brings a drain current to a certain constant cutoff level, which waveform responds to the applied step voltage and is variable with time, is analyzed. The step voltage, to which a constant voltage $V_1$ from a power supply 25 is added, is applied through a resistor 3 to the drain terminal 13. To the drain terminal 3, there is connected an operational amplifier 2 for monitoring variations in the drain voltage, i.e., variations in the drain current, to adjust the gate voltage to the threshold voltage. The operational amplifier 2 has a noninverting input terminal 21 connected to the drain terminal 13, an inverting input terminal 22 to which the step voltage for controlling the drain voltage is applied, and an output terminal 23 connected to a gate terminal 12 of the FET 1. The voltage at the output terminal 23 is the threshold voltage of the FET 1. If it is assumed that the drain current (cutoff level) for controlling the threshold voltage of the FET 1 is indicated by $I_1$ and the power supply 25 has a voltage $V_1$, the resistance of the resistor 3 will be indicated by $V_1/I_1$. The circuit shown in FIG. 16 may be incorporated in the apparatus shown in FIG. 6 for carrying out measurements and calculations according to the program shown in FIG. 8 to display three-dimensional data as shown in FIG. 5.

While the transistor being measured comprises an FET in some of the above embodiments, the principles of the present invention are also applicable to the measurement of a bipolar transistor insofar as the source, gate, and drain are regarded respectively as emitter, gate, and collector.

Using the waveform analyzing method according to the present invention, each of deep levels in a semiconductor device which affect the waveform of a response of the device can be clearly analyzed. Since the determination of the positions of maximum values of response waveforms, which has been required by the conventional processes such as DLTS, is no longer necessary, the time required for measurement and analysis is greatly reduced, and errors in identifying deep levels are also reduced.

Although certain preferred embodiments of the present invention have been shown and described in detail, it should be understood that various changes and modifications may be made therein without departing from the scope of the appended claims.

What is claimed is:

1. A method of measuring and displaying a waveform of a response, variable with time, of an output characteristic from a terminal of a semiconductor device in response to a step voltage applied to a terminal thereof, comprising the steps of:

measuring and recording in a recording device an outcome of a multiplication operation of a time t and a derivative, with respect to time, of the waveform of a response of the output characteristic after the elapse of time t from the application of the step voltage at each of a plurality of temperatures T; and displaying on a display means the recorded outcome in a form of a three-dimensional representation in a space coordinate system having a first axis representing the reciprocals of the temperatures T, a second axis representing the logarithms of the products of the squares of the temperatures T and the time t, and a third axis representing said outcome of a multiplication operation of the derivative and the time t.

2. A method of displaying a waveform of a response, variable with time, of a current from a terminal of a diode or a transistor mounted on a substrate in response to a step voltage applied to a terminal thereof, comprising the steps of:

measuring and recording the product of a time t and a derivative, with respect to time, of the waveform of a response of the current after the elapse of time t from the application of the step voltage at each of a plurality of temperatures T; and displaying the recorded products three-dimensionally in a space coordinate system having a first axis representing the reciprocals of the temperatures T, a second axis representing the logarithms of the products of the squares of the temperatures T and the time t, and a third axis representing the product of the derivatives and the time t.

3. A method of displaying a waveform of a response, variable with time, of a capacitance between two terminals of a diode or a transistor mounted on a substrate in response to a step voltage applied to a terminal thereof, comprising the steps of:

measuring and recording the product of a time t and a derivative, with respect to time, of the waveform of a response of the capacitance after the elapse of time t from the application of the step voltage at each of a plurality of temperatures T; and displaying the recorded products three-dimensionally in a space coordinate system having a first axis representing the reciprocals of the temperatures T, a second axis representing the logarithms of the products of the squares of the temperatures T and the time t, and a third axis representing the product of the derivatives and the time t.

4. A method of displaying a waveform of a response, variable with time, of a voltage at a terminal of a diode or a transistor mounted on a substrate, which voltage is to be applied to keep a current from a terminal thereof at a certain level, in response to a step voltage applied to a terminal thereof, comprising the steps of:

measuring and recording the product of a time t and a derivative, with respect to time, of the waveform of a response of the voltage after the elapse of time t from the application of the step voltage at each of a plurality of temperatures T; and displaying the recorded products three-dimensionally in a space coordinate system having a first axis representing the reciprocals of the temperatures T, a second axis representing the logarithms of the products of the squares of the temperatures T and the time t, and a third axis representing the product of the derivatives and the time t.

* * * * *

UNITED STATES PATENT AND TRADEMARK OFFICE
CERTIFICATE OF CORRECTION

PATENT NO. : 5,493,208
DATED : February 20, 1996
INVENTOR(S) : Norio GOTO

It is certified that error appears in the above-indentified patent and that said Letters Patent is hereby corrected as shown below:

Column 1, line 49, delete "$\cdot E_T$" and insert -- $—E_T$ --.

Signed and Sealed this

Second Day of July, 1996

BRUCE LEHMAN

*Attest:*

*Attesting Officer*  *Commissioner of Patents and Trademarks*